US005290967A

United States Patent [19]

Shimaya

[11] Patent Number: 5,290,967

[45] Date of Patent: Mar. 1, 1994

[54] AUTOMATIC PERFORMANCE DATA PROGRAMING INSTRUMENT WITH SELECTIVE VOLUME EMPHASIS OF NEW PERFORMANCE

[75] Inventor: Hideaki Shimaya, Hamamatsu, Japan

[73] Assignee: Yamaha Corporation, Hamamatsu, Japan

[21] Appl. No.: 911,673

[22] Filed: Jul. 9, 1992

[30] Foreign Application Priority Data

Jul. 9, 1991 [JP] Japan .................................. 3-168506

[51] Int. Cl.[5] ........................ G10H 7/00; G10H 1/46; H03G 3/00

[52] U.S. Cl. ........................................ 84/633; 84/609

[58] Field of Search .................. 84/609, 610, 633, 634

[56] References Cited

U.S. PATENT DOCUMENTS

| | | | |
|---|---|---|---|
| 4,476,763 | 10/1984 | Uya et al. . | |
| 4,930,390 | 6/1990 | Kellogg et al. | 84/611 |
| 5,123,323 | 6/1992 | Fujita et al. | 84/633 X |
| 5,138,926 | 8/1992 | Stier et al. | 84/634 X |
| 5,220,118 | 6/1993 | Konishi | 84/609 |
| 5,227,573 | 7/1993 | Nakano | 84/622 |
| 5,229,533 | 7/1993 | Sakurai | 84/618 |

*Primary Examiner*—William M. Shoop, Jr.
*Assistant Examiner*—Jeffrey W. Donels
*Attorney, Agent, or Firm*—Spensley Horn Jubas & Lubitz

[57] ABSTRACT

The automatic performance data programming instrument is constructed to program and record an object part of the automatic performance data by physically playing an input implement such as a keyboard. During the course of the programing operation, the automatic performance data is fed to a sound source for simultaneous tone generation. The volume information contained in the automatic performance data is selectively altered so as to intensify a tone volume of the object part relative to those of the remaining parts, in order to facilitate evaluation of the performance effect associated to the object part.

19 Claims, 11 Drawing Sheets

AUTOMATIC PERFORMANCE DATA PROGRAMING INSTRUMENT WITH SELECTIVE VOLUME EMPHASIS OF NEW PERFORMANCE

BACKGROUND OF THE INVENTION

The present invention relates to an electronic musical instrument having function to program and reproduce an automatic performance data in playback mode.

There has been known an automatic performance data programing instrument operable to program a plurality of performance data corresponding to a plurality of parts such as a rhythm part, a bass part, a chord part and so on. An operator or a user can designate a particular object part to be programed or revised in some type of the conventional automatic performance data programing instrument. In such an instrument, the operator can input a new performance data into the designated object part by playing a keyboard on real time basis while the remaining parts are performed concurrently according to old performance data. In such a type of the automatic performance data programing instrument, the operator can selectively program a performance data of the object part while evaluating a balance or harmony of all the parts.

However, the conventional automatic performance data programing instrument has a drawback that musical tones of the object part is buried in background musical tones of the remaining parts. The user suffers from a difficulty in distinguishing and evaluating a performance effect of the object part.

SUMMARY OF THE INVENTION

In view of the above noted drawback of the prior art, an object of the invention is to provide an improved automatic performance data programing instrument featuring clear emphasis of a performance effect of an object part to thereby facilitate selective programing of an automatic performance data in the playback mode. The inventive automatic performance data programing instrument is comprised of performance data memory means for memorizing a plurality of automatic performance data corresponding to a plurality of parts, part designating means for designating an object part among the plurality of parts, performance data input means for inputting a new automatic performance data, recording means for recording the new automatic performance data into the object part, reading means for reading out the plurality of automatic performance data from the performance data memory means, musical tone reproducing means for reproducing musical tones according to the plurality of the read automatic performance data, and tone volume controlling means for controlling the musical tone reproducing means to boost a volume of reproduced musical tones of the object part relative to those of the remaining parts. According to such a construction, during the course of the inputting and simultaneous recording of the new performance data, the volume of the musical tones of the object part can be boosted or emphasized relative to those of the remaining unchanged parts to thereby facilitate instant recognition of the performance effect associated to the new performance data of the object part.

In the more specific form, the automatic performance data programing instrument comprises performance data input means for inputting a performance data of a first part, first memory means assigned to the first part, recording means for recording the inputted performance data into the first memory means, second memory means storing another performance data of a second part, reading means for reading out the performance data of the second part from the second memory means, musical tone reproducing means operative based on both of the inputted performance data of the first part and the read performance data of the second part for reproducing musical tones, and tone volume controlling means for boosting a volume of reproduced tones of the first part relative to those of the second part.

DETAILED DESCRIPTION OF THE INVENTION

Figure 1:
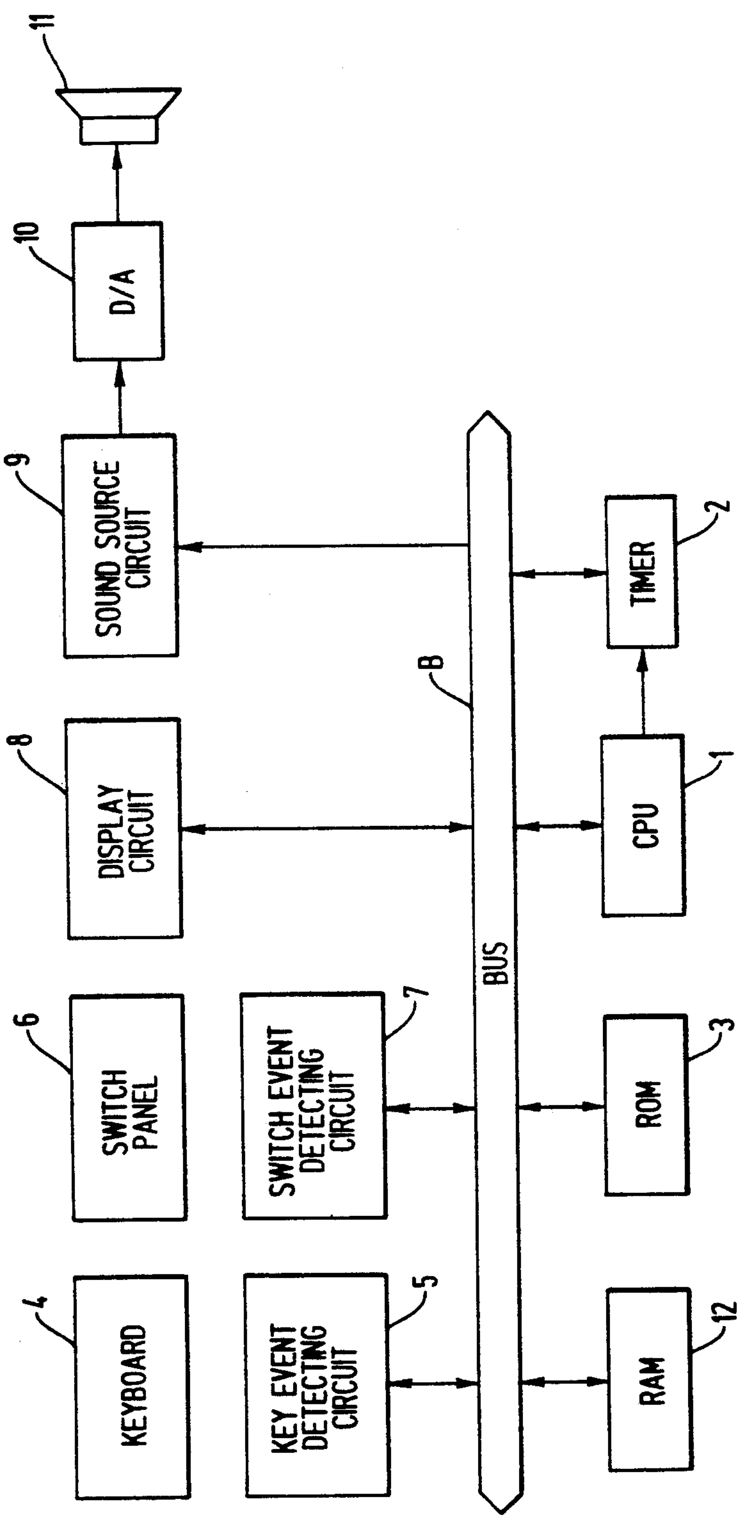
FIG. 1 is a block diagram showing an overall construction of one embodiment of the inventive automatic performance data programing instrument.
Figure 2:
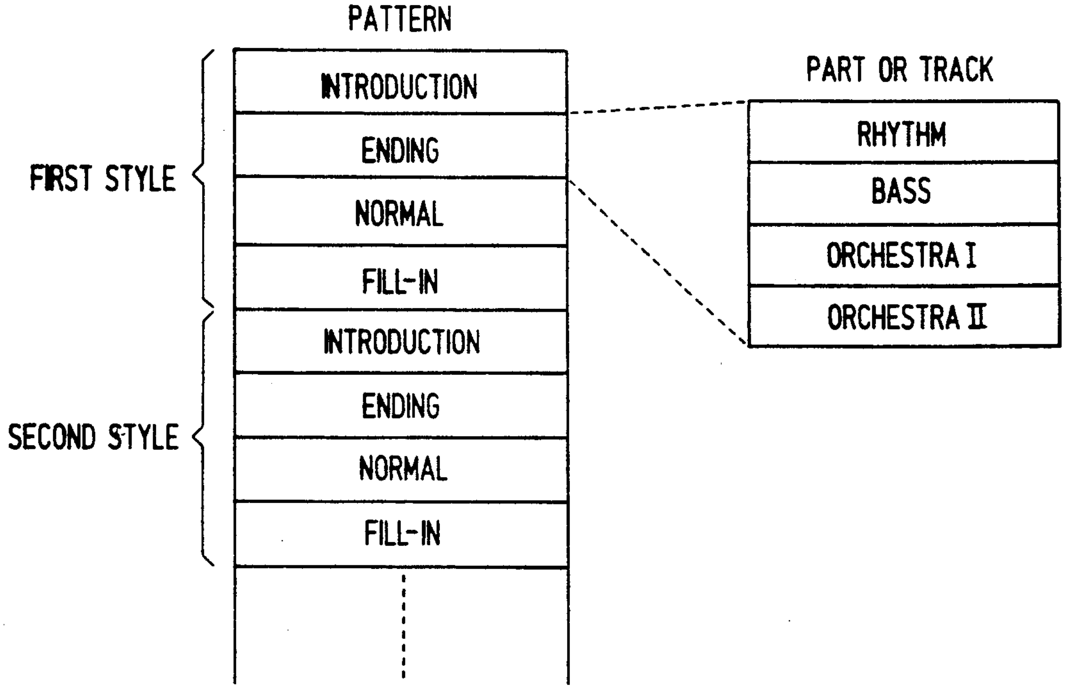
FIG. 2 is a diagram showing a basic arrangement of an automatic performance data in the form of an accompaniment data programed in the embodiment.
Figure 3:
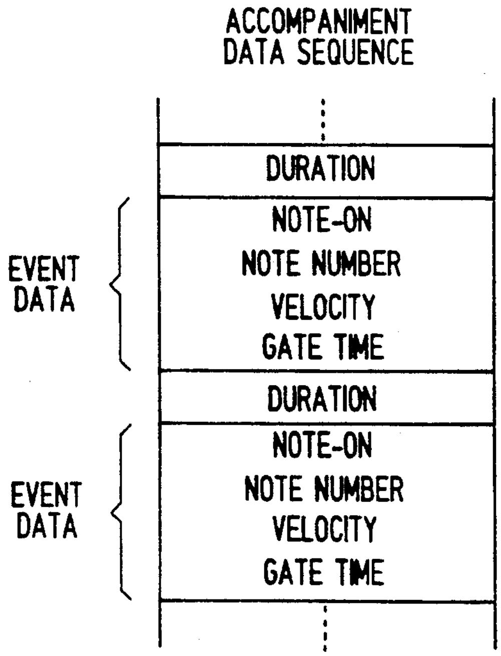
FIG. 3 is a diagram showing a detailed arrangement of an accompaniment data recorded in the embodiment.

Hereinafter, one embodiment of the invention will be described in conjunction with the drawings. FIG. 1 is a block diagram showing an overall construction of the inventive automatic performance data programing instrument. This electronic musical instrument is designed programable to form, revise or edit an accompaniment data. As shown in the figure, the instrument is provided with a central processing unit or CPU 1 connected through a bus B to transmit and receive a control data and an accompaniment data etc. to and from various units of the instrument for controlling the overall operation of the automatic performance data programing instrument. A timer 2 is provided for feeding a timer interruption signal to the CPU 1 each constant period. A read-only memory or ROM 3 is provided to store various control programs executed by CPU 1 as well as a plurality of standard or prescribed accompaniment data corresponding to various music styles such as, Rock'n'roll I, Rock'n'roll II, Discotheque I and so one, as shown in FIG. 2. Further, the respective one of the accompaniment data corresponding to each style is composed of an introduction pattern, an ending pattern, a normal pattern and a fill-in pattern. Further, each pattern is composed of four parts of Rhythm, Bass, Orchestra I and Orchestra II. Each part is comprised of one measure length of accompaniment data. The accompaniment data is formed basically of an alternate sequence of a duration data and an event data effective to command tone generation. As shown in FIG. 3, one composite event data includes a note-on data component indicative of start of tone generation, a note number data component indicative of a particular note to be sounded, a velocity data component indicative of an intensity of a tone, and a gate time data component indicative of a sounding tone length. The duration data indicates a silent interval time between separate tone reproductions according to preceding and succeeding event data.

Figure 4:
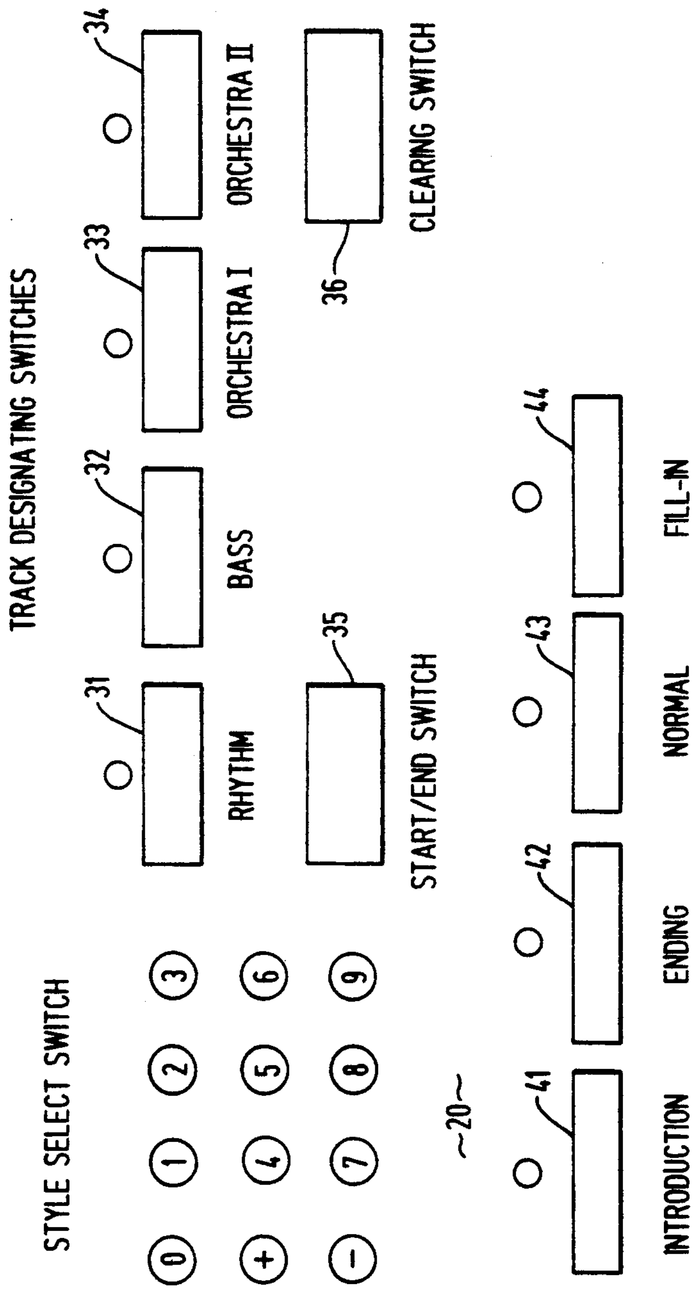
FIG. 4 is a plan view showing a switch panel provided on the embodiment.

Referring back to FIG. 1, the instrument further includes a keyboard 4 provided with multiple keys, and a key event detecting circuit 5 for detecting key-on and key-off operations performed on the keyboard 4. A switch panel 6 is mounted on the performance data programing instrument and is formed with various switches. A switch event detecting circuit 7 is connected to detect ON/OFF states of each switch such that the detected result is fed to the CPU 1. FIG. 4 shows major switches mounted on the switch panel 6. These switches include a style select switch 20 manually operable to select one of the styles such as Rock'n-'roll I, Rock'n'roll II, Discotheque I and so on. The style select switch 20 is comprised of a pair of plus and minus keys and ten number of digit keys. A set of track designating switches 31-34 are mounted to manually designate a particular track or part to be programed. The respective switches 31-34 correspond to four tracks of Rhythm, Bass, Orchestra I and Orchestra II. A start/end switch 35 is provided to command start and end of programing and recording of an accompaniment data. Further, a clearing switch 36 is provided to clear the old programed data when it is depressed. A set of pattern designating switches 41-44 are provided to designate a particular one of the patterns to be programed. The respective switches 41-44 correspond to the four kind patterns of introduction, ending, normal and fill-in. In addition, light emitting diode (LED) lamps are provided on top of the respective track designating switches 31-34 and the pattern designating switches 41-44 so as to display or indicate currently designated track and pattern.

Referring again back to FIG. 1, the instrument further includes a display circuit 8 and a sound source circuit 9 for generating a digital musical tone signal. A digital/analog converter or D/A converter 10 converts the digital musical tone signal into an analog signal. A sound system 11 receives the analog signal so as to generate a musical tone. A random access memory or RAM 12 has memory areas utilized as registers and flags for storing various control data. Major registers and flags are listed below.

LIST OF REGISTERS AND FLAGS

Tempo clock register TC: incremented periodically each occurrence of a timer interruption signal.

Recording flag REC: settable to "1" to establish a recording mode where a new accompaniment data inputted by the keyboard operation is recorded or written into the RAM 12.

Style register STYL: storing a code number of a style selected by the user.

Pattern register PTRN: storing a code number of a pattern designated by the user.

Track register TRACK: storing a code number of a track designated by the user.

Timing register TIME: memorizing a time data indicative of a current time slot sequence within one measure in terms of values "0"-"95". The timing register TIME is incremented subordinately to the increment of the tempo clock register TC in response to the occurrence of the timer interruption signal.

Wait flags WAIT 1 and WAIT 2: utilized to check as to enability of shift to the recording mode.

Figure 5:
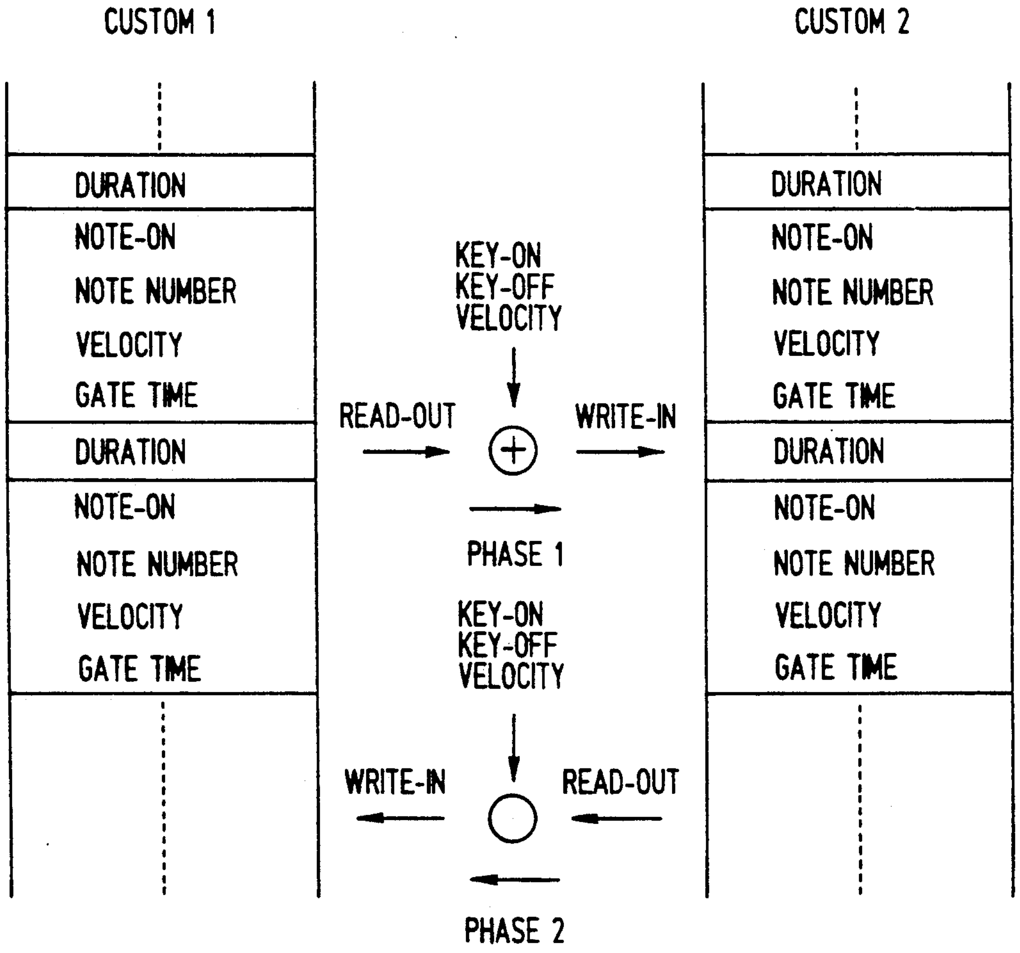
FIG. 5 is a schematic diagram showing a process of making a custom accompaniment data in the embodiment.

Referring to FIG. 5, the RAM 12 has a specific memory region assigned to define a first custom data area CUSTOM 1 and a second custom data area CUSTOM 2. These areas are utilized as a working memory area for programing or making a free accompaniment data (hereinafter, referred to as "custom data"). The first custom data area has a memory capacity effective to memorize a complete set of accompaniment data covering four patterns×four tracks=sixteen parts each style, while the second custom data area has a memory capacity effective to memorize one part length of an accompaniment data. In the inventive automatic performance data programing instrument, the custom data is formed by repeatedly carrying out a first data transfer PHASE 1 and a second data transfer PHASE 2 reciprocally between the pair of first and second custom data areas each cycle of one measure period. The first data transfer is effected such that an accompaniment data retrieved from the first custom data area is added with another accompaniment data based on physical performance information such as key-on, key-off and velocity or key touch, which are inputted by the keyboard operation, and the added result is written into the second custom data area. On the other hand, the second data transfer is effected such that an accompaniment data retrieved from the second custom data area is added with another accompaniment data based on physical performance information inputted by the keyboard operation, and the added result is written back into the first custom data area to thereby update the recorded accompaniment data.

Figure 6:
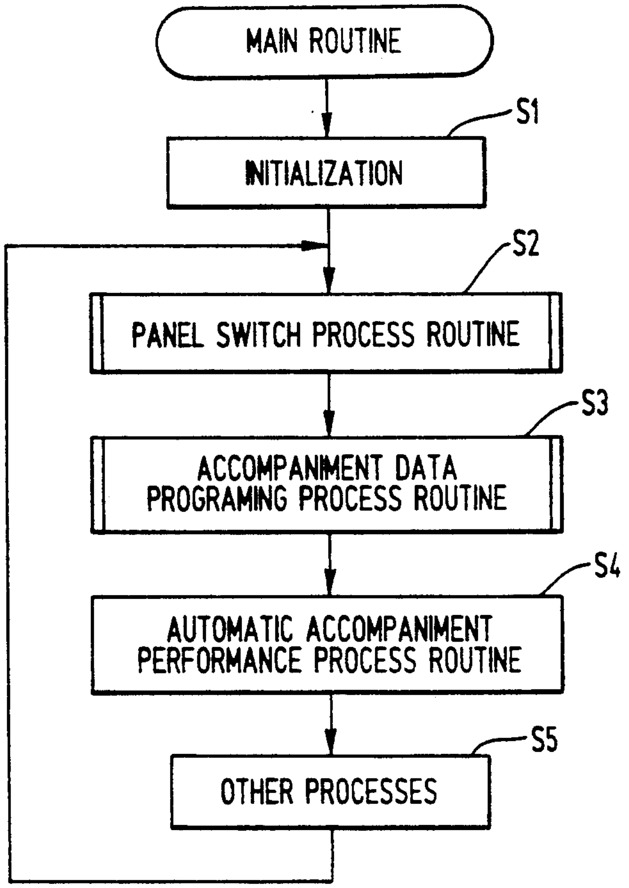
FIGS. 6–15 are flowcharts showing the operation of the embodiment.
Figure 7:
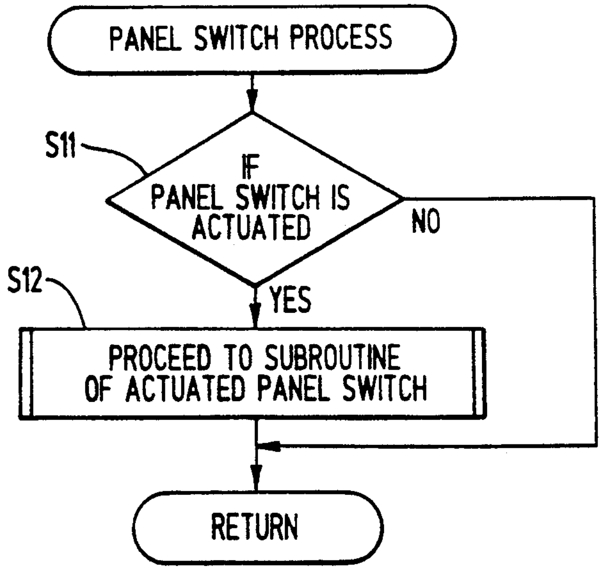

Hereinafter, the operation of the present embodiment will be described. Referring to FIG. 6, when a power source (not shown) is turned on in the automatic performance data programing instrument, the CPU 1 starts processing of the main routine. Firstly, Step S1 is undertaken to write initial values into controlling registers and flags provided in the RAM 12. Consequently, the recording flag REC and the wait flags WAIT 1 and WAIT 2 are reset so that the instrument is placed in a normal mode as an electronic keyboard musical instrument. Then, Step S2 is undertaken to call a panel switch process routine to thereby proceed to Step S11 shown in FIG. 7. Check is made in Step S11 as to if any of panel switches is actuated or depressed. In case that the check result shows YES, subsequent Step S12 is undertaken to carry out a particular subroutine corresponding to the actuated panel switch, thereafter returning to the main routine. On the other hand that the check result is found NO in Step S11, the operation returns to the main routine without undertaking Step S12.

Figure 8:
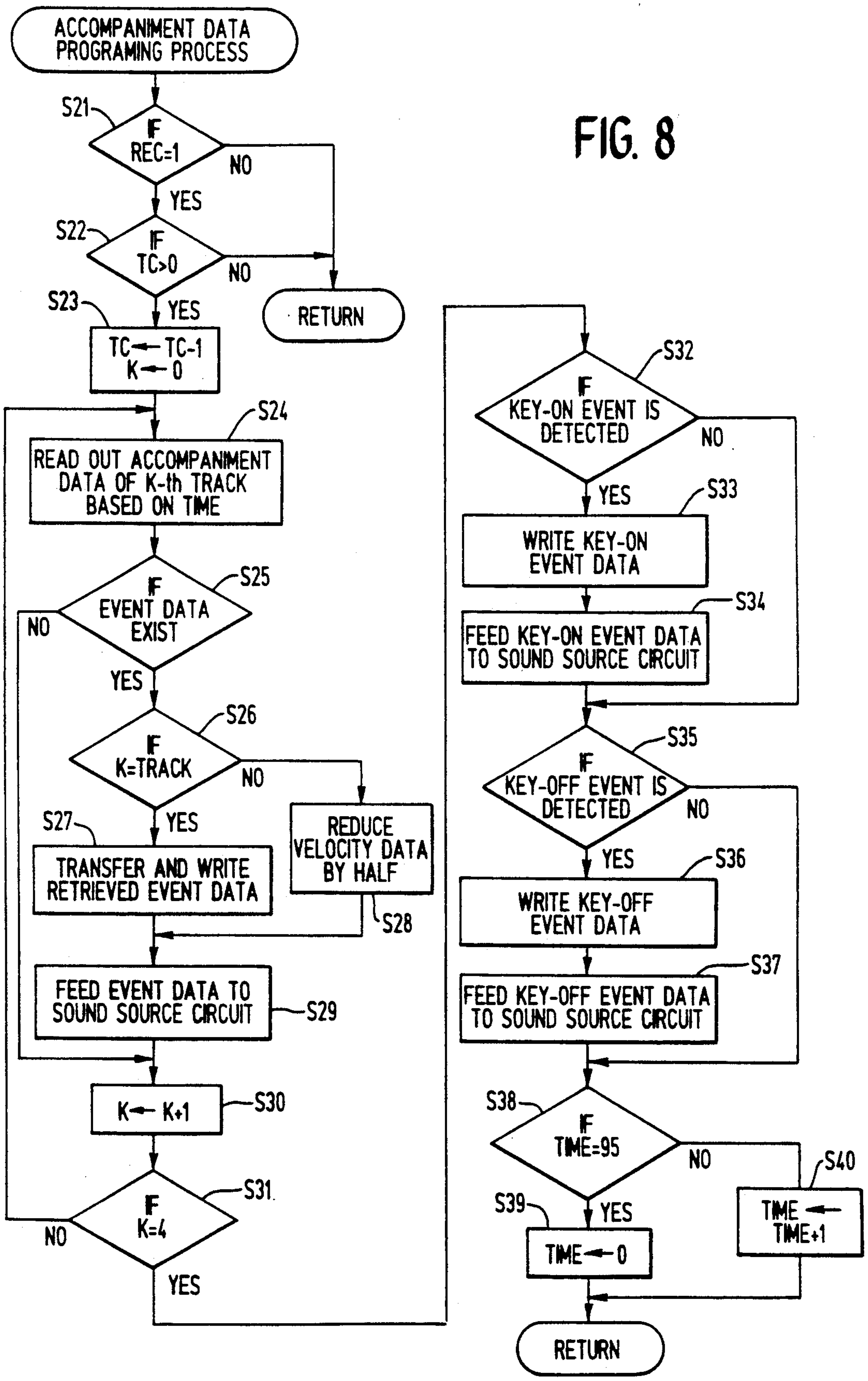

Referring back to the main routine of FIG. 6, next Step S3 is undertaken to call an accompaniment data programing process routine shown in FIG. 8. Then, Step S21 of the FIG. 8 routine is undertaken to check as to whether the recording flag REC indicates "1". In case that this check result is held YES, subsequent Step S22 and following steps are undertaken to execute a given process. On the other hand that the recording flag REC is held in the reset state, the check result of Step S21 remains NO, thereby immediately returning to the main routine.

Figure 9:
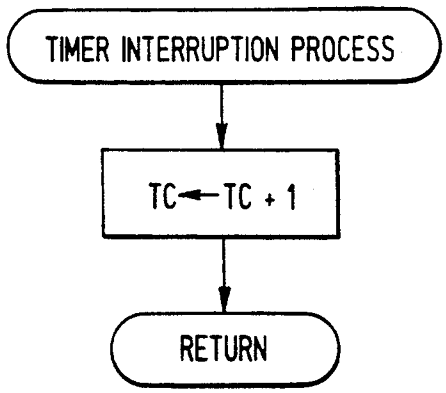

Referring back again to the main routine of FIG. 6, subsequent Step S4 is undertaken to carry out an automatic accompaniment performance process routine in playback mode according to a given accompaniment data of a selected style provided that the automatic accompaniment is commanded. Then, Step S5 is undertaken to carry out other processes such as a volume control according to an operation of a volume controller. Thereafter, the loop of Steps S2–S5 is repeatedly executed. Meanwhile, when a timer interruption signal is inputted into the CPU 1, a timer interruption process routine of FIG. 9 is called and executed, and the tempo clock register TC is incremented.

Figure 10:
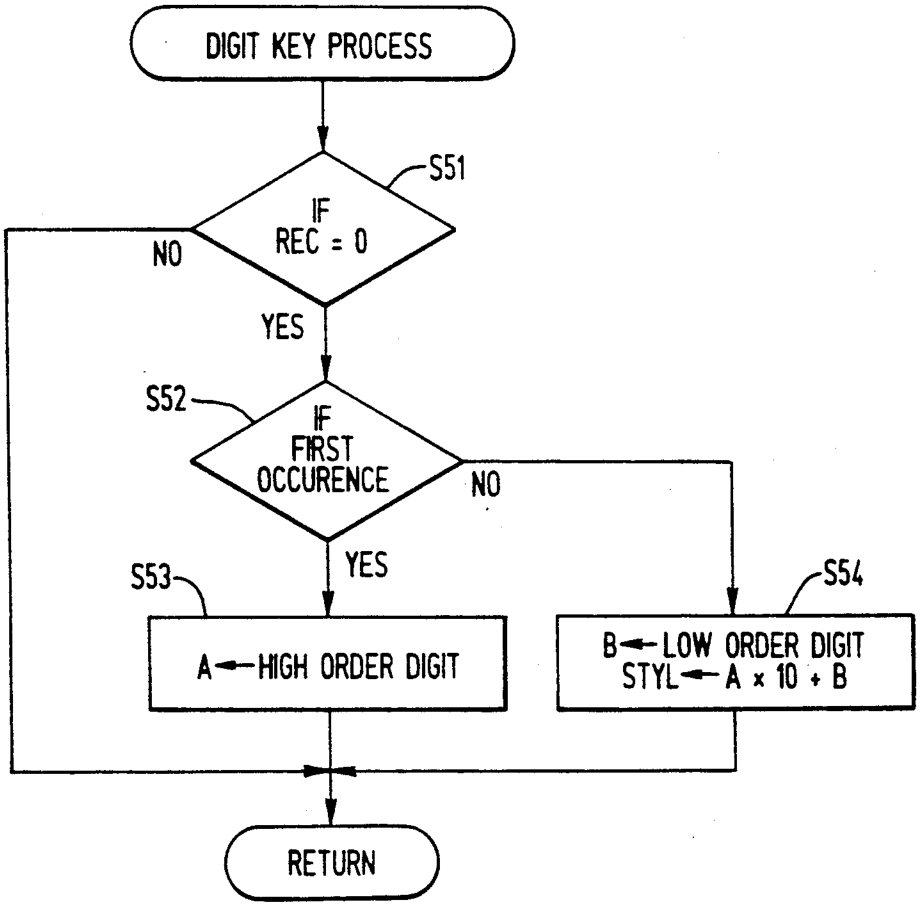

Before commencing programing of the automatic accompaniment data, the user actuates a plus key, a minus key or digit keys provided on the style select switch 20 so as to select a particular style. Each style is designated by a code number in the form of a set of two digits. When the user inputs the high order digit by a certain digit key, a digit key process routine of FIG. 10 is called via Step S12 of the panel switch process routine. Referring to FIG. 10, firstly Step S51 is undertaken to check as to whether the content of the recording flag REC indicates "0". In case that this check result shows YES, subsequent Step S52 is carried out to check as to whether the current digit key actuation is of a first occurrence. At this moment, the check result of Step S52 is held YES to thereby proceed to Step S53 in which the inputted high order digit is loaded into a register A. Thereafter, processing returns to the main routine via the panel switch process routine. Next, when the other low order digit is inputted by a certain digit key, the digit key process routine is again called to thereby proceed to Step S52. At this time, the check result of Step S52 is held NO to thereby branch to Step S54, in which the inputted low order digit is loaded into a register B. Thereafter, a computation of $A \times 10 + B$ is effected and the computed result is stored in the style register STYL. Then, processing returns to the main routine via the panel switch process routine. In the state of REC="1", the check result of Step S51 is held NO, hence processing immediately returns to the main routine via the panel switch process routine with skipping Step S52 and following Steps. Namely, the digit key actuation is simply ignored once the recording mode is established.

Figure 11:
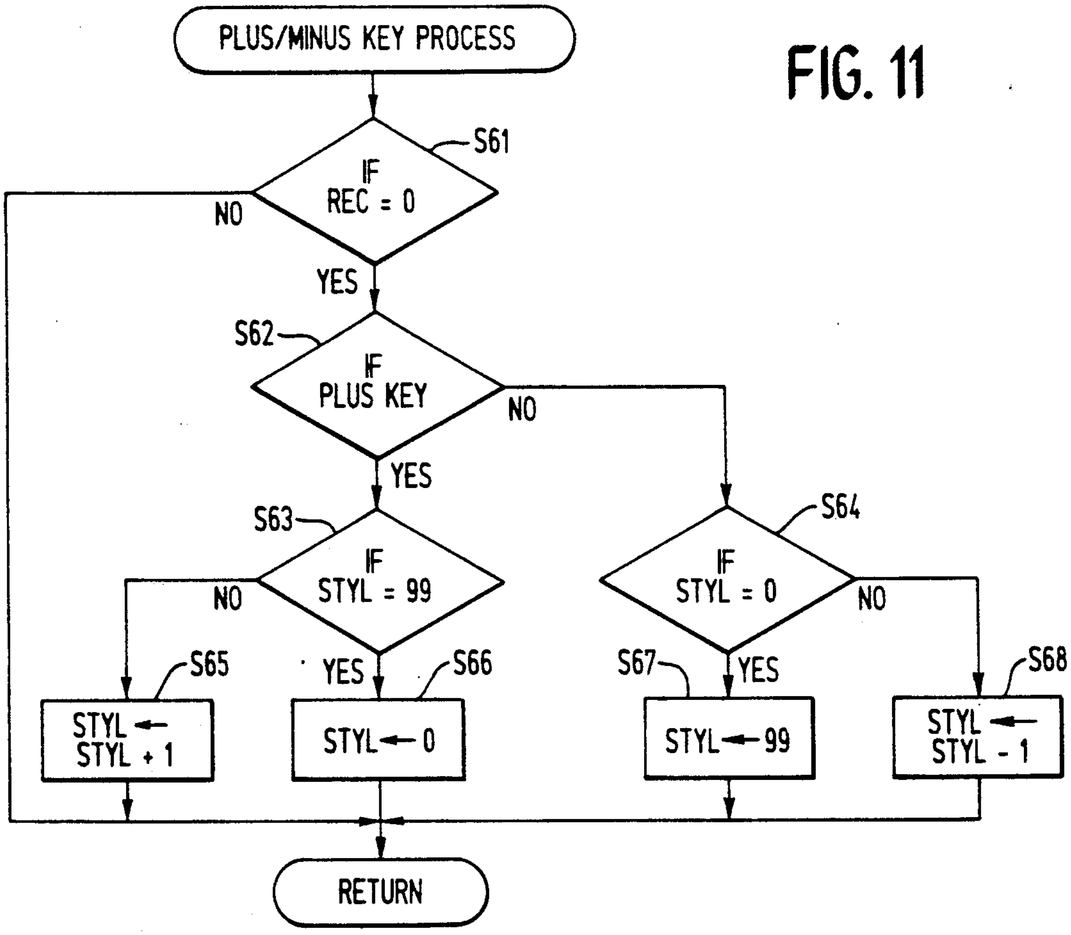

Further, the user may actuate the plus key or minus key in order to change a content of the style register STYL. Consequently, when Step S12 is undertaken in the panel switch process routine, a plus/minus key process routine of FIG. 11 is called. Firstly, Step S61 is undertaken to check as to whether the content of the recording flag REC indicates "0". In case that this check result shows YES, subsequent Step S62 is undertaken to check as to whether the actuated key is a plus key or a minus key. In case that the check result is found YES, Step S63 is undertaken to check as to if the content of the style register indicates "99". In case that this check result shows NO, the style register STYL is incremented in Step S65. On the other hand that the check result is found YES, the style register STYL is set to "0" in Step S66. Thereafter, processing returns to the main routine via the panel switch process routine.

On the other hand that the user depresses the minus key so that the check result of Step S62 is turned NO, processing advances the other way to Step S64 in which check is made as to if the content of the style register indicates "0". In case that this check result shows NO, the style register STYL is decremented in Step S68. On the other hand that the check result is found YES, the style register STYL is set with "99" at Step S67. Thereafter, processing returns to the main routine via the panel switch process routine. In manner similar to the digit key input operation, the check result of Step S61 is held NO under the condition REC="1", hence processing immediately returns to the main routine with skipping Step S62 and following Steps. By such operation, a code number of a desired style is set in the style register STYL.

Figure 12:
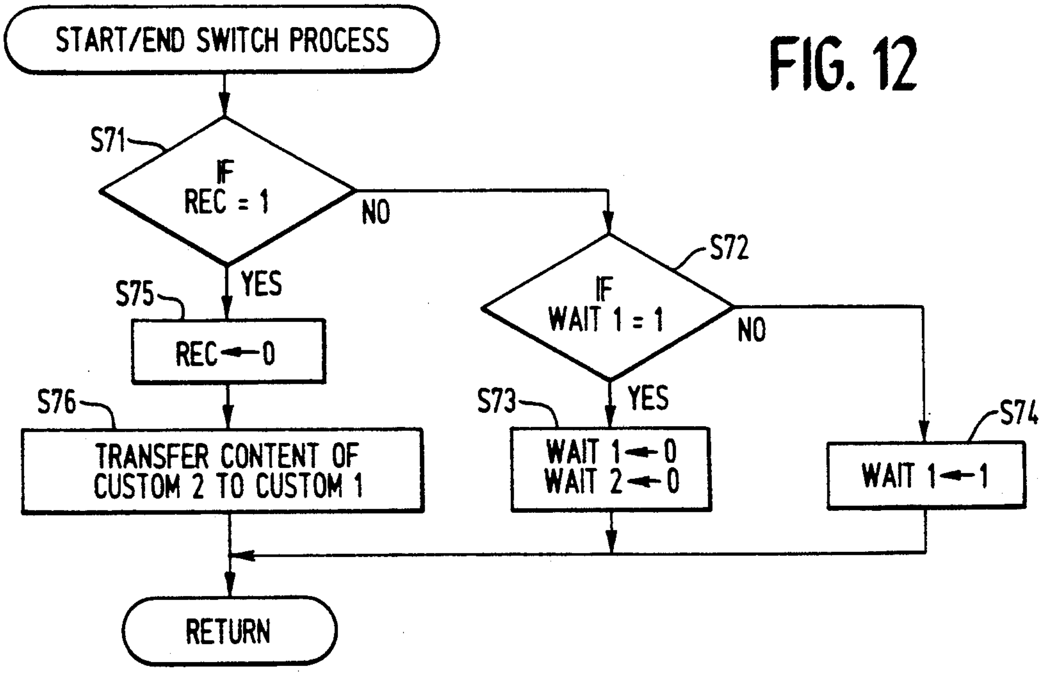

Next, the user depresses the start/end switch 35. Consequently, a start/end switch process routine of FIG. 12 is called via Step S12 of the panel switch process routine. Firstly, Step S71 is undertaken to check as to if the content of the recording flag REC indicates "1". In case that the check result shows YES, subsequent Step S75 is carried out. In case of NO, branched Step S72 is alternately carried out. Namely, in case that the content of the recording flag REC indicates "0", the check result of Step S71 is held NO to thereby advance to Step S72. Then, subsequent check is made as to if the content of the wait flag WAIT 1 indicates "1". In case that this check result shows NO, the wait flag WAIT 1 is set with "1" in Step S74, thereafter returning to the main routine via the panel switch process routine. On the other hand that the check result of Step S72 is held YES, both of the wait flags WAIT 1 and WAIT 2 are reset to "0" in Step S73, thereafter returning to the main routine. Referring back to Step S71, in case that the check result of Step S71 is held YES, subsequent Step S75 is undertaken as mentioned before to reset the recording flag REC to "0". Then, a custom data is transferred from the second custom data area CUSTOM 2 to the first custom data area CUSTOM 1, thereafter returning to the main routine.

Next, the user depresses a particular one of the pattern designating switches 41–44 corresponding to a given pattern to be programed. Consequently, there is called a pattern switch process routine shown in FIG. 13 via Step S12 of the panel switch process routine. Firstly, Step S101 is undertaken to check as to whether the content of the recording flag REC indicates "0". In case that the content indicates "0", the check result of Step S101 is held YES to thereby advance to Step S102 so as to check as to if the depressed one is the pattern designating switch 41 which is associated to the introduction pattern. In case that this check result is found YES, subsequent Step S105 is undertaken to write into the pattern register PTRN a code number "0" which indicates the introduction pattern. On the other hand that the check result of Step S102 is held NO, branched Step S103 is undertaken to check as to if the depressed one is the pattern designating switch 42 associated to an ending pattern. In case that this check result is found YES, subsequent Step S106 is carried out to write into the pattern register PTRN a code number "1" associated to the ending pattern. On the other hand that the check result of Step S103 is held NO, branched Step S104 is undertaken to check as to if the depressed one is the pattern designating switch 42 associated to a normal pattern. In case that this check result is found YES, the pattern register PTRN is written with a code number "2" which indicates the normal pattern in Step S107. In case of NO, the pattern register PTRN is written with a code number "3" which indicates the fill-in pattern in Step S108. After effecting one of Steps S105–S108, processing leads to Step S109 to check as to whether the content of the wait flag WAIT 2 indicates "1". In case that this check result shows NO, branched Step S110 is carried out so as to check as to if the content of the wait flag WAIT 1 indicates "1". In case that this check result shows NO, i.e., in case that the content of the wait flag WAIT 1 indicates "0", processing returns to the main routine via the panel switch process routine. On the other hand that the check result of Step S110 is found YES, subsequent Step S111 is carried out to set the other wait flag WAIT 2 with a value "1", thereafter returning to the main routine via the panel switch process routine.

Figure 13:
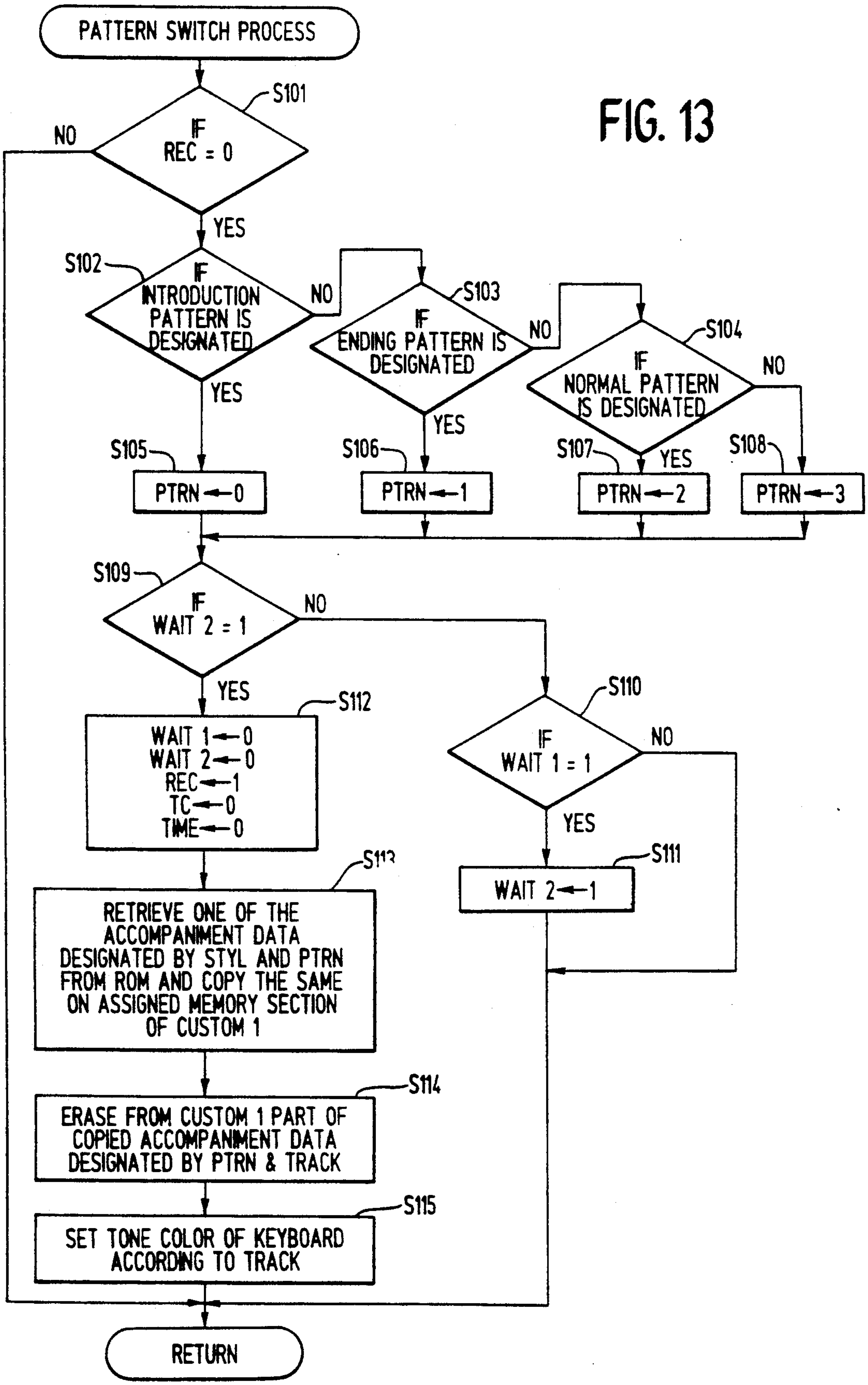

Referring back to Step S109 of FIG. 13, in case that the check result of this Step is found YES, subsequent Step S112 is carried out such that the wait flag WAIT 1 is set with "0", the other wait flag WAIT 2 is set with "0", the recording flag REC is set with "1", the tempo clock register TC is set with "0" and the timing register TIME is set with "0". Then, Step S113 is carried out such that a particular one of the accompaniment data designated by the contents of STYL and PTRN is retrieved from the ROM 3 (FIG. 1) and is then copied on an assigned memory section of CUSTOM 1. Next, Step S114 is carried out so as to erase from CUSTOM 1 a particular part of the copied accompaniment data, which is identified by the contents of PTRN and TRACK. Then, Step S115 is carried out to set a tone color of the keyboard according to the content of TRACK, thereafter returning to the main routine. Meaning of these Steps will become apparent later.

Figure 14:
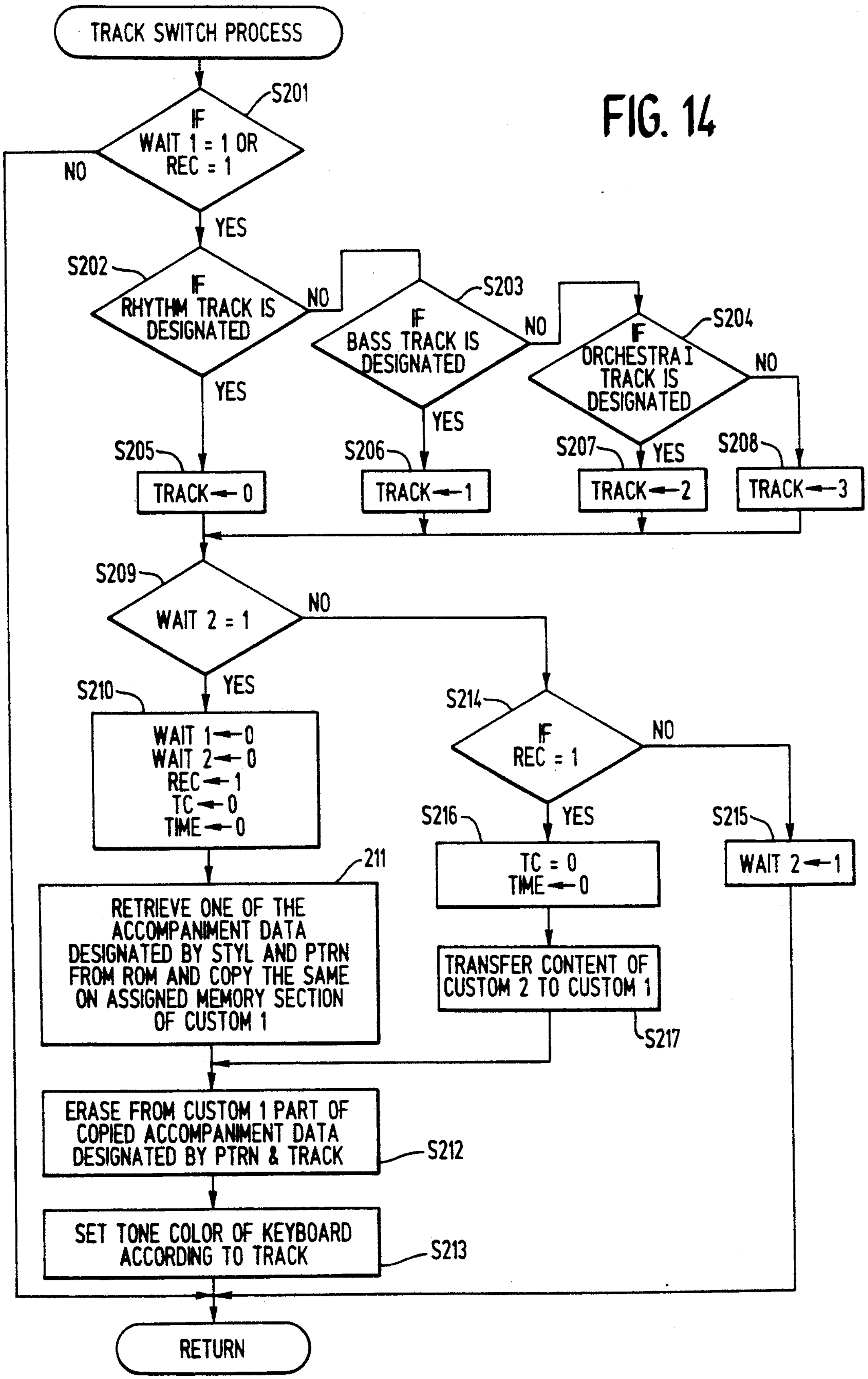

Next, the user depresses one of the track designating switches 31-34, associated to a particular track to be programed. Consequently, there is called a track switch process routine of FIG. 14 via Step S12 of the panel switch process routine. Firstly, Step S201 is undertaken to check as to if either of the wait flag WAIT 1 and the recording flag REC indicates "1". In case that the recording flag REC indicates "0", the check result of Step S201 is turned YES only when the content of the wait flag WAIT 1 indicates "1". At this stage, if the wait flag WAIT 1 has held "0" before the depression of the start/end switch 35, the wait flag WAIT 1 is set to "1" immediately after the start/end switch 35 is depressed at Step S74 of the start/end switch process routine. Accordingly, the check result of Step S201 is found YES to thereby proceed to Step S202. Then, check is made as to if the depressed one is the track designating switch 31 associated to the Rhythm track. In case that this check result shows YES, Step S205 is undertaken to write into the track register TRACK a code number "0" corresponding to the Rhythm track. On the other hand that the check result of Step S202 is held NO, branched Step S203 is undertaken to check as to if the depressed one is the track designating switch 32 associated to the Bass track. In case that this check result shows YES, subsequent Step S206 is undertaken to write into the track register TRACK a code number "1" corresponding to the Bass track. On the other hand that the check result of Step S203 is held NO, branched Step S204 is undertaken to check as to if the depressed one is the track designating switch 33 associated to the Orchestra I. In case that this check result shows YES, the track register TRACK is written with a code number "2" corresponding to the Orchestra I track in Step S207. In case of NO, the track register TRACK is written with a code number "3" corresponding to the Orchestra II track in Step S208.

Thereafter, processing advances from one of Steps S205-S208 to Step S209 where check is made as to whether the wait flag WAIT 2 indicates "1". In case that one of the pattern designating switch 41-44 has been depressed before one of the track designating switch 31-34 is selectively actuated and that the wait flag WAIT 2 has indicated "0" at that moment, the wait flag WAIT 2 has been set with "1" in Step S111 of the pattern switch process routine. Therefore at this moment, the check result of Step S209 is found YES. Thus, subsequent Step S210 is undertaken such that both of the wait flags WAIT 1 and WAIT 2 are reset to "0", the recording flag REC is set to "1", and both of the tempo clock register TC and the timing register TIME are written with "0". Then, Step S211 is carried out such that the ROM 3 is accessed to read out a particular accompaniment data representative of the pattern designated by the pattern register PTRN from the style selected by the style register STYL. The retrieved accompaniment data is written into the first custom data area CUSTOM 1. Subsequent Step S212 is carried out such that the written accompaniment data is partly erased from a particular section of the first custom data area CUSTOM 1. The CUSTOM 1 is composed of a plurality of memory sections corresponding to four patterns×four tracks=sixteen parts as described before. The erased accompaniment data belongs to one part designated by the pattern register PTRN and the track register TRACK. Then, Step S213 is carried out such that a particular tone color assigned to the designated track to be programed is set for the keyboard, thereafter returning to the main routine via the panel switch process routine. In such a manner, the style select switch, the pattern designating switch and the track designating switch are sequentially actuated to thereby set the recording flag REC to establish the recording mode.

Supplementary description is given in case that the track designating switch is firstly depressed and then the pattern designating switch is depressed in a reverse manner. In this case, when the track switch process routine is called by the depression of the track designating switch, the wait flag WAIT 2 is set with "0". Therefore, the check result of Step S209 is held NO to thereby proceed to Step S214. Then, check is made as to whether the content of the recording flag REC indicates "1". Since the recording flag REC is set with "0" prior to the start of recording, the check result of Step S214 shows NO to thereby proceed to Step S215 where the wait flag WAIT 2 is set to "1", thereby returning to the main routine. Thereafter, the pattern designating switch is depressed to call the pattern switch process routine. As shown in FIG. 13, since the wait flag WAIT 2 has been set at this moment, the check result of Step S109 is found YES. Accordingly, subsequent Steps S112-S115 are carried out as noted before in the same manner as Steps S210-S213 of the track switch process routine. By such a manner, the recording mode (REC="1") is introduced by actuating both of the track designating switch and the pattern designating switch without regard to the depression order of these switches. In addition, in case that the check result is held NO in Step S214 of the FIG. 14 routine, subsequent Steps S216 and S217 are carried out such that the tempo clock register TC and the timing register TIME are reset, and the content of CUSTOM 2 is transferred to the CUSTOM 1.

In the recording mode (REC="1"), when the accompaniment data programing process routine of FIG. 8 is called via Step S3 of the main routine, the first check result of Step S21 is turned YES to thereby proceed to Step S22. Then, check is made as to if the content of the tempo clock register TC is greater than "0". In case that this check result shows NO, processing returns immediately to the main routine. On the other hand that the timer interruption routine is called to increment the tempo clock register TC so that its content is made "1" or more, the check result of Step S22 is turned YES to thereby proceed to Step S23. Then, the tempo clock register TC is decremented by one unit "1" and a controlling variable K is initialized to "0".

Next Step S24 is carried out to retrieve an accompaniment data from a particular track designated by the variable K based on the content of the timing register TIME. The detailed description is given below for Step S24. Firstly, a duration data is successively retrieved from a particular memory section, corresponding to the K-th track, of a currently read-out custom data area, and the retrieved duration data is accumulated or added to the past values thereof. If the added result exceeds "96", a value "96" is subtracted from the added result. At the first cycle of the recording operation, the first custom data area CUSTOM 1 serves as the read-out custom data area. The added result is successively compared to the content of the timing register TIME. Upon coincidence therebetween, an event data is retrieved after the lastly retrieved duration data. If the added result never coincides with the content of the timing register TIME, the comparison is again carried out at a next cycle routine without reading out an event data. Such comparison is repeatedly carried out until reaching the coincidence.

Next, Step S25 is undertaken to check as to if the event data exists. In case that the added result has not coincided with the content of the timing register TIME and the event data has not been read out, this check result is held NO so that processing jumps to Step S30 where the control variable K is incremented. Then, Step S31 is carried out to check as to if K=4. In case that this check result shows NO, processing returns back to Step S24.

On the other hand that the content of the timing register TIME and the added result coincide with each other and the event data is read out after the last duration data, the check result of Step S25 is held YES to thereby proceed to Step S26. Then, check is made as to if the value of the control variable K coincides with the content of the track register TRACK, i.e., the check is made as to whether the track from which the event data is retrieved at Step S24 is an object track to be programed. In case that this check result shows YES, processing proceeds to Step S27 to thereby write the event data retrieved at Step S24 into a current write-in custom data area which is the second custom data area CUSTOM 2 in the first cycle of the programing operation. Next Step S29 is carried out to feed to the sound source circuit 9 the event data which is retrieved at Step S24 and which contains the note number data component, the velocity data component and the gate time data component. Consequently, there is generated a sound having a tone pitch corresponding to the note number data component, a tone volume corresponding to the velocity data component and a tone length determined by the gate time data component. Then, processing advances to Step S30. On the other hand that K≠T, i.e., the track from which the event data is retrieved at Step S24 is not the object track, the check result of Step S26 shows NO to thereby branch to Step S28. Then, the velocity data component contained in the retrieved event data is reduced by half. Next, Step S29 is carried out such that the event data having the reduced velocity data component is fed to the sound source circuit 9. Consequently, the sound is generated at a smaller tone volume than that generated when reproducing the object track.

After repeating the above process until K=4 is reached, the check result of Step S31 is turned YES to thereby proceed to Step S32. Check is made as to if a key-on event is detected by means of the key event detecting circuit 5. In case that this check result shows NO, processing jumps to Step S35 to thereby check as to if a key-off event is detected by means of the key event detecting circuit 5. In case that this check result shows NO, processing again jumps to Step S38 to thereby check as to if the value of the timing register TIME reaches "95" which corresponds to an end of one measure. In case that this check result is found NO, Step S40 is undertaken to increment the timing register TIME to thereby return to the main routine. By such a manner, everywhen the timer interruption routine is called to increment the tempo clock register TC, Step S23 and subsequent Steps are executed so that the timing register TIME is incremented at Step S40. Accordingly, the timing register TIME substantially follows the occurrence of the timer interruption signal such that its content is incremented. On the other hand that the check result of Step S38 is found YES, Step S39 is carried out to write "0" into the timing register, thereafter returning to the main routine.

Referring back to Step S32, in case that the key-on event is detected so that the check result of Step S32 is found YES, subsequent Step S33 is carried out such that the key-on event data including a note-on data component, a note number data component of the key-on event and a velocity data component is written into a particular memory section designated by the track register TRACK within the current write-in custom data area. Then, Step S34 is carried out to feed the note-on data component, the note number data component and the velocity data component, associated to the detected key-on event, to the sound source circuit 9 to thereby effect tone generation.

Thereafter, when a key-off event is detected, the check result of Step S35 is found YES to thereby proceed to Step S36. Then, the old content of the timing register TIME at the time of the key-on event detection is subtracted from the current content thereof, and the subtracted result is written as a gate time data component or key-off event data into the write-in custom data area. Then, Step S37 is carried out to feed the key-off event data to the sound source circuit 9 to thereby stop the tone generation.

By such a manner, the accompaniment data programing process routine is repeatedly executed to effect instant reproduction of the accompaniment data recorded in the custom data area and to effect recording of the accompaniment data inputted by the user into the custom data area. Thereafter, when the content of the timing register TIME reaches "95", the timing register TIME is cleared to "0". Further, the old write-in custom data area is reversed to a new read-out custom data area, and the old read-out custom data area is reversed to a new write-in custom data area. Then, the second cycle of the programing operation is executed in updating manner.

In an operating period of the recording mode where REC="1", WAIT 1="0" and WAIT 2="0", when the user depresses a track designating switch, the track switch process routine is called so that the track register TRACK is updated to a new track code number associated to the newly depressed track designating switch. Thereafter, processing proceeds to Step S214 of FIG. 14. Then, the check result of Step S214 is turned YES to thereby proceed to Step S216 as described before so as to clear both of the tempo clock register TC and the timing register TIME to "0". Subsequently, Step S217 is carried out so as to transfer the content of the second custom data area CUSTOM 2 to the first custom data area CUSTOM 1, thereby leading to Step S212. Consequently hereafter, when the accompaniment data programing process routine is called, a key event data inputted by operation of the keyboard is recorded into the new track designated by the track register TRACK.

Figure 15:
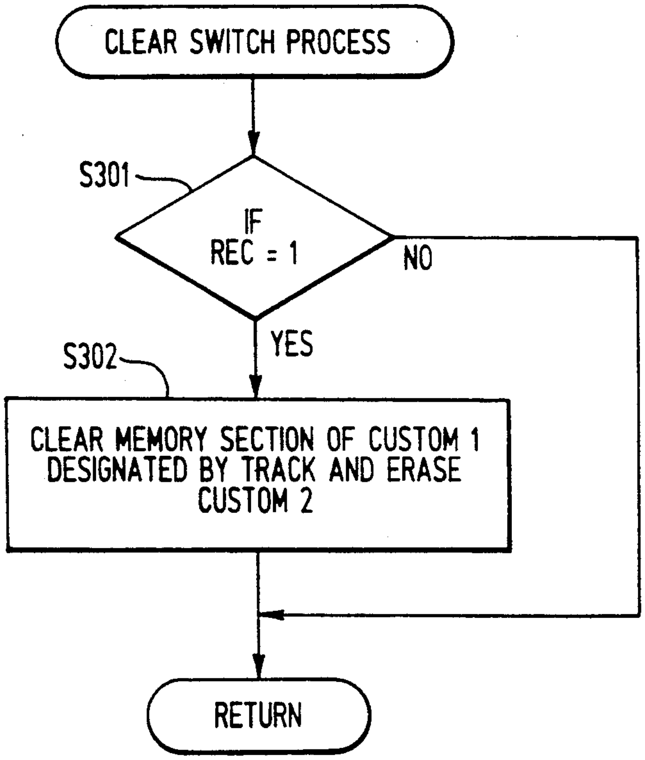

In the event that the clear switch 36 is depressed by the user, a clear switch process routine shown in FIG. 15 is called via the panel switch process routine. Firstly, Step S301 is undertaken to check as to whether the recording flag REC indicates "1". In the recording mode, the check result of Step S301 is found YES to thereby proceed to Step S302. Then, the memory section designated by the track register TRACK within the first custom data area CUSTOM 1 is cleared, and the content of the second custom data area CUSTOM 2 is erased, thereby returning to the main routine. In case that the recording mode is not selected, the check result of Step S301 shows NO, thereby simply returning to the main routine.

The technological scope of the present invention is not limited to the above described embodiment. For example, in case of programing a rhythm pattern, one kind of musical instrument tone may be treated as one part. The invention is applied to program a desired part of the performance data representative of the musical instrument tone. Though the above described embodiment is directed to the programing of the automatic accompaniment data, the invention may be applied to programing of a regular automatic performance data having a plurality of parts. Further, an additional control switch may be adopted to select whether the tone volume of the remaining parts is reduced by half, or is set identical to that of the object part to be programed. By such modification, the operability is improved to facilitate evaluation of the performance effect of the object part as well as evaluation of the overall tone volume balance. Besides that the tone volume of the remaining parts other than the object part is lowered as in the above described embodiment, the tone volume of the object part may be boosted. Alternatively, the tone volume of the object part is simply boosted while the tone volume of the remaining parts is kept unchanged. The tone volume control may be effected through a specific control parameter which is provided to control a tone volume level of respective parts and which is set variably to change the tone volume level, instead of varying the velocity data. Though the standard or prescribed automatic performance data is initially erased from a memory section assigned to the object part and thereafter a new automatic performance data inputted by the keyboard operation is recorded in the above described embodiment, the invention is not limited to such a recording manner. For example, an inputted performance data through the keyboard operation may be additionally written without erasing the prescribed standard automatic performance data, thereby easily revising and developing the standard automatic performance data.

As described above, according to the present invention, the automatic performance data programing instrument is comprised of performance data memory means for memorizing a plurality of automatic performance data corresponding to a plurality of parts, part designating means for designating an object part among the plurality of parts, performance data input means for inputting a new automatic performance data, recording means for recording the new automatic performance data into the object part, retrieving means for retrieving the plurality of automatic performance data from the performance data memory means, musical tone reproducing means for reproducing musical tones according to the plurality of the retrieved automatic performance data, and tone volume controlling means for controlling the musical tone reproducing means to boost a volume of reproduced musical tones of the object part relative to those of the remaining parts. By such a construction, the inventive instrument advantageously facilitates evaluation of the automatic performance effect of the object part to be programed, thereby improving the operability of the automatic performance data programing function.

What is claimed is:

1. An automatic performance data programing instrument comprising:

performance data memory means for memorizing a plurality of automatic performance data which correspond to a plurality of parts and which contain at least a given data effective to determine a tone volume;

reading means for reading out the plurality of automatic performance data from the performance data memory means;

part designating means for designating an object part among the plurality of parts;

performance data input means for inputting a new automatic performance data containing a given data effective to determine a tone volume for the object part;

tone volume controlling means for varying the given date so as to boost a tone volume of the object part relative to those of the remaining parts;

musical tone generating means for generating musical tones during the course of inputting of the new automatic performance data based on the plurality of the automatic performance data inputted for the object part and read out from the remaining parts so as to emphasize the object part according to the varied given data effective to determine the tone volume; and recording means for recording the inputted new automatic performance data containing the given data effective to determine a tone volume, into the object part of the performance data memory means.

2. An automatic performance data programing instrument according to claim 1; wherein the tone volume controlling means comprises means for varying a velocity data component which is contained in a composite automatic performance data and which is effective to determine a volume of the reproduced musical tones.

3. An automatic performance data programing instrument according to claim 1; wherein the part designating means includes a style selecting switch manually operable to select a desired accompaniment style of an automatic performance data, a pattern designating switch manually operable to designate a desired pattern in the selected accompaniment style, and a track designating switch manually operable to designate a desired track of the designated pattern to thereby determine an object part.

4. An automatic performance data programing instrument according to claim 3; wherein the part designating means includes means operative when both of the pattern designating switch and the track designating switch are operated for setting a recording mode effective to enable the recording means.

5. An automatic performance data programing instrument according to claim 4; wherein the part designating means includes means responsive to an operation of another track designating switch under the recording mode for changing an object part.

6. An automatic performance data programing instrument according to claim 1; wherein the recording means includes means for updating the recorded automatic performance data in response to an operation of the performance data input means.

7. An automatic performance data programing instrument according to claim 1; wherein the part designating means includes a plurality of switches corresponding to the plurality of parts.

8. An automatic performance data programing instrument according to claim 1; wherein the tone volume controlling means includes means for controlling to reduce a volume of the reproduced musical tones of the respective parts except for the object part.

9. An automatic performance data programing instrument according to claim 1; including means for switching the tone volume controlling means between an effective state and an ineffective state.

10. An automatic performance data programing instrument according to claim 1; wherein the performance data memory means includes means for memorizing a plurality of automatic performance data representative of an automatic accompaniment pattern.

11. An automatic performance data programing instrument according to claim 10; including pattern memory means for memorizing a plurality of automatic accompaniment patterns each comprised of a plurality of parts, pattern designating means for designating one of the plurality of automatic accompaniment patterns, and copying means for copying automatic performance data of the designated automatic accompaniment pattern into the performance data memory means from the pattern memory means.

12. An automatic performance data programing instrument according to claim 1; wherein the reading means includes first means for repeatedly reading out the plurality of automatic performance data corresponding to a plurality of parts, and second means for adding the inputted new automatic performance data to the read automatic performance data of the object part.

13. An automatic performance data programing instrument according to claim 1; wherein the performance data memory means has a plurality of memory tracks corresponding to a plurality of parts.

14. An automatic performance data programing instrument comprising:

performance data input means for inputting a performance data of a first part, the performance data containing at least a given data effective to determine a tone volume;

first memory means assigned to the first part;

second memory means storing another performance data of a second part, said another performance data containing another given data effective to determine a tone volume;

reading means for reading out the performance data of the second part from the second memory means;

tone volume controlling means for varying the given data so as to boost a tone volume of the first part relative to that of the second part;

musical tone generating means for generating musical tones based on both of the inputted performance data of the first part and the read performance data of the second part to emphasize the first part according to the varied given data during the course of the inputting; and recording means for recording the inputted performance data into the first memory means.

15. An automatic performance data programing instrument according to claim 14; wherein the tone volume controlling means includes means for controlling to reduce a volume of the reproduced musical tones of the second part.

16. An automatic performance data programing instrument according to claim 14; wherein the tone volume controlling means comprises means for varying a velocity data component which is contained in a composite performance data and which is effective to determine a volume of the reproduced musical tones.

17. An automatic performance data programing instrument according to claim 14; including means for switching the tone volume controlling means between an effective state and an ineffective state.

18. An automatic performance data programing instrument according to claim 14; wherein each of the first and second memory means includes means for memorizing a performance data for use in automatic accompaniment performance.

19. An automatic performance data programing instrument according to claim 14; wherein the reading means includes means for repeatedly reading out the performance data of the second part, and the recording means includes means for repeatedly retrieving the performance data of the first part from the first memory means and for adding the inputted performance data to the retrieved performance data of the first part.

* * * * *